US008716689B2

(12) United States Patent
Chen et al.

(10) Patent No.: US 8,716,689 B2
(45) Date of Patent: May 6, 2014

(54) THERMAL DIODE DEVICE AND METHODS

(75) Inventors: Chuan-Hua Chen, Cary, NC (US);
Jonathan B. Boreyko, Durham, NC (US); Yuejun Zhao, Durham, NC (US)

(73) Assignee: Duke University, Durham, NC (US)

( * ) Notice: Subject to any disclaimer, the term of this patent is extended or adjusted under 35 U.S.C. 154(b) by 47 days.

(21) Appl. No.: 13/259,917

(22) PCT Filed: Apr. 21, 2010

(86) PCT No.: PCT/US2010/031943
§ 371 (c)(1),
(2), (4) Date: Sep. 23, 2011

(87) PCT Pub. No.: WO2010/124025
PCT Pub. Date: Oct. 28, 2010

(65) Prior Publication Data
US 2012/0012804 A1    Jan. 19, 2012

Related U.S. Application Data

(60) Provisional application No. 61/171,182, filed on Apr. 21, 2009.

(51) Int. Cl.
*H01L 29/02*    (2006.01)
*H01L 21/00*    (2006.01)

(52) U.S. Cl.
USPC ................................................ 257/2; 438/54

(58) Field of Classification Search
USPC ..................... 257/2; 438/54; 62/50
See application file for complete search history.

(56) References Cited

U.S. PATENT DOCUMENTS

| | | | | |
|---|---|---|---|---|
| 5,771,967 A | * | 6/1998 | Hyman | 165/274 |
| 2006/0157227 A1 | | 7/2006 | Choi et al. | |
| 2007/0224391 A1 | * | 9/2007 | Krupenkin et al. | 428/141 |
| 2007/0297959 A1 | * | 12/2007 | Suzuta et al. | 422/312 |
| 2008/0128116 A1 | | 6/2008 | Dangelo et al. | |
| 2011/0016886 A1 | * | 1/2011 | Ghoshal et al. | 62/3.2 |

FOREIGN PATENT DOCUMENTS

JP    2005-055066 A    3/2005
KR    10-2003-0018478 A    3/2003

OTHER PUBLICATIONS

Korean Patent Office, PCT International Preliminary Report on Patentability and Written Opinion of the International Searching Authority for International Application No. PCT/US2010/031943 dated Oct. 25, 2011.
Korean Patent Office, PCT International Search Report and Written Opinion of the International Searching Authority for International Application No. PCT/US2010/031943 dated Nov. 22, 2010.
Groll, M., et al., "Development of a Liquid-Trap Heat Pipe Thermal Diode", J. Spacecraft, 16(4):195 (Jul.-Aug. 1979).

(Continued)

*Primary Examiner* — Julio J Maldonado
*Assistant Examiner* — Moin Rahman
(74) *Attorney, Agent, or Firm* — Christopher J. Knors; Moore & Van Allen PLLC

(57) ABSTRACT

A thermal diode comprising a superlyophobic surface, and a lyophilic surface separated from the superlyophobic surface defining a chamber. A liquid is disposed in the chamber, the liquid capable of phase changing during operation of the thermal diode. Methods of cooling and insulating bodies and rectifying heat transfer using the thermal diode.

30 Claims, 6 Drawing Sheets

(56) References Cited

OTHER PUBLICATIONS

Tadanaga, Kiyoharu, et al., "Superhydrophobic-Superhydrophilic Micropatterning on Flowerlike Alumina Coating Film by the Sol-Gel Method", Chem. Mater., 12:590-592 (2000).

Varga, Szabolcs, et al., "Characterisation of thermal diode panels for use in the cooling season in buildings", Energy and Buildings, 34:227-235 (2002).

Takata, Y., et al., "Pool boiling on a superhydrophilic surface", International Journal of Energy Research, 27:111-119 (2002).

Wu, Xufeng, et al., "Fabrication of a lotus-like micro-nanoscale binary structured surface and wettability modulation from superhydrophilic to superhydrophobic", Nanotechnology, 16:2056-2060 (2005).

Chang, C.W., et al., "Solid-State Thermal Rectifier", Science, 314:1121-1123 (2006).

Larmour, Iain A., et al., "Remarkably Simply Fabrication of Superhydrophobic Surfaces Using Electroless Galvanic Deposition", Angew. Chem. Int. Ed., 46:1710-1712 (2007).

* cited by examiner

THERMAL DIODE DEVICE AND METHODS

CROSS-REFERENCE TO RELATED APPLICATIONS

This application is filed under the provisions of 35 U.S.C. §371 and claims the benefit of International Patent Application No. PCT/2010/031943, filed on 21 Apr. 2010 entitled "THERMAL DIODE DEVICE AND METHODS", which claims the benefit of priority of U.S. Provisional Patent Application No. 61/171,182, filed on 21 Apr. 2009, each of which is hereby incorporated by reference herein in its entirety.

TECHNICAL FIELD

The present disclosure is related to a thermal diode device and methods for rectifying heat transfer. More specifically, the disclosure relates to a thermal diode comprising a superlyophobic surface and a lyophilic surface separated by a distance defining a chamber, and a phase-changing liquid in the chamber. The instant thermal diode is useful for transporting and rectifying heat flows

BACKGROUND

Thermal diodes are devices that rectify heat flows. Thermal diodes that have been reported can be divided into two categories, solid-state thermal diodes based on non-uniform nanotubes or two-segment bars, and phase-change thermal diodes based on asymmetric heat pipes, respectively. Although solid-state thermal diodes can work for a wide range of temperature, reported diodicities are very low (typically <1.1). Likewise, heat pipe based thermal diode exhibit high diodicity (typically >100), however, the rectification is dramatically reduced (<10) when one-dimensional heat pipes are painstakingly integrated in a planar configuration. In phase-change thermal diodes, particularly those in a two-dimensional (planar) configuration, it is a tremendous challenge to design a system to ensure effective liquid return from the condenser to the evaporator. The planar thermal diode with phase change is implemented in a closed-system often called a vapor chamber, which is essentially a planar version of the heat pipe.

State-of-the-art vapor chamber heat spreaders typically use porous wick structures with pore sizes of the order of 100 micron or less to induce capillarity-driven liquid return, but such wick structures have distinct and inherent disadvantages. For example, wick structures generally have very large thermal resistance, which inhibits efficient heat transfer. Another disadvantage of wicked vapor chambers is manufacturability, especially when incorporating wick structures on the side walls and integrating them with in-plane wick structures. Orientation dependence is also an issue for conventional vapor chambers because gravity can affect the return of liquid from the evaporator to the condenser. It is therefore advantageous is to have a wickless evaporator that does not need any porous wicking structure at all, and to have a liquid return mechanism that does not depend on the orientation of external forces.

SUMMARY

In a first embodiment, a thermal diode is provided. The diode comprises a superlyophobic surface, a lyophilic surface separated from the superlyophobic surface and defining a chamber, and a liquid in the chamber, the liquid capable of phase changing during operation of the thermal diode.

In a first aspect of the first embodiment, the thermal diode has a diodicity of at least 1.1.

In a second aspect of the first embodiment, the thermal diode has a diodicity of at least 1.5.

In a third aspect, alone or in combination with any one of the previous aspects of the first embodiment, the thermal diode has an aspect ratio defined as either a length or a width over a height of greater than 2, such that the thermal diode is essentially two-dimensional.

In a fourth aspect, alone or in combination with any one of the previous aspects of the first embodiment, the thermal diode further comprises a spacer to separate the superlyophobic and lyophilic surfaces a predetermined distance. The spacer provides fluidic sealing of the chamber and prevents or reduces thermal conduction during operation of the thermal diode.

In a fifth aspect, alone or in combination with any one of the previous aspects of the first embodiment, at least one of the superlyophobic surface and the lyophilic surface comprises copper, silicon, aluminum, or steel.

In a sixth aspect, alone or in combination with any one of the previous aspects of the first embodiment, the superlyophobic surface is disposed on or formed on a surface comprising copper, silicon, aluminum, or steel.

In a seventh aspect, alone or in combination with any one of the previous aspects of the first embodiment, the liquid is water.

In an eighth aspect, alone or in combination with any one of the previous aspects of the first embodiment, at least one of the superlyophobic surface and the lyophilic surface is disposed on or formed on a copper surface and the liquid is water.

In a ninth aspect, alone or in combination with any one of the previous aspects of the first embodiment, the lyophilic surface is superlyophilic.

In a tenth aspect, alone or in combination with any one of the previous aspects of the first embodiment, the thermal diode is independent of gravity or other external forces during operation thereof.

In an eleventh aspect, alone or in combination with any one of the previous aspects of the first embodiment, thermal rectification with a diodicity of at least 1.1 is integrated with two-phase heat transfer with a coefficient of at least 1,000 W/m2·K.

In a twelfth aspect, alone or in combination with any one of the previous aspects of the first embodiment, the lyophilic surface is wickless.

In a second embodiment, a system is provided. The system comprises (i) a thermal diode comprising a superlyophobic surface, a lyophilic surface separated from the superlyophobic surface and defining a chamber, and a liquid in the chamber, the liquid capable of phase changing during operation of the thermal diode; and (ii) at least one body thermally coupled to the thermal diode. The body can be selected from at least one of an electronic device, a biological system, a medical implant, a dwelling, a construction material, a window, a motorized land or water vehicle, a satellite, an aerospace vehicle, a chemical processing plant, a power plant, a mechanical machine, an electromechanical system, an energy harvesting device, a nuclear reactor, and an energy storage system.

In a third embodiment, a method of rectifying heat flow is provided. The method comprising providing a chamber having asymmetric surface wettability, the chamber defined by a superlyophobic surface, a lyophilic surface separated from the superlyophobic surface; and a liquid disposed in the chamber, the liquid capable of phase changing during operation of the thermal diode; and transporting the liquid asymmetrically in the chamber between the superlyophobic surface and the lyophilic surface.

In a first aspect of the third embodiment, the superlyophobic surface provides for the conversion of surface energy associated with coalesced drops of the liquid to kinetic energy.

In a second aspect, alone or in combination with any one of the previous aspects of the third embodiment, operation of the thermal diode is independent of gravity or other external forces.

In a third aspect, alone or in combination with any one of the previous aspects of the third embodiment, the method further comprises transferring heat from a heated body sufficient to evaporate at least some of the liquid from the lyophilic surface and to provide vapor droplets of the liquid; and coalescing at least some of the vapor droplets on the superlyophobic surface at a temperature lower than the lyophilic surface; and cooling the body.

In a fourth aspect, alone or in combination with any one of the previous aspects of the third embodiment, wherein a heated body is in contact with the superlyophobic surface; wherein the method further comprises containing the liquid on or in the lyophilic surface, and preventing or reducing heat transfer from the body.

In a fifth aspect, alone or in combination with any one of the previous aspects of the third embodiment, the thermal diode has a diodicity of at least 1.1.

In a sixth aspect, alone or in combination with any one of the previous aspects of the third embodiment, the thermal diode has a diodicity of at least 1.5.

In a seventh aspect, alone or in combination with any one of the previous aspects of the third embodiment, the thermal diode has an aspect ratio defined as either a length or a width over a height of greater than 2, such that the thermal diode is essentially two-dimensional.

In an eighth aspect, alone or in combination with any one of the previous aspects of the third embodiment, the method further comprises a spacer adjusting the distance between the superlyophobic surface and the lyophilic surface. The spacer provides fluidic sealing of the chamber and prevents or reduces thermal conduction during operation of the thermal diode.

In a ninth aspect, alone or in combination with any one of the previous aspects of the third embodiment, the surfaces comprises copper or silicon.

In a tenth aspect, alone or in combination with any one of the previous aspects of the third embodiment, the liquid is water.

In an eleventh aspect, alone or in combination with any one of the previous aspects of the third embodiment, at least one of the lyophobic surface and the lyophilic surface is disposed on or formed on a copper or silicon surface and the liquid is water.

In a twelfth aspect, alone or in combination with any one of the previous aspects of the third embodiment, the lyophilic surface is superlyophilic.

In a thirteenth aspect, alone or in combination with any one of the previous aspects of the third embodiment, thermal rectification with a diodicity of at least 1.1 is integrated with two-phase heat transfer with a coefficient of at least 1,000 W/m2·K.

In a fourteenth aspect, alone or in combination with any one of the previous aspects of the third embodiment, the evaporator is wickless.

BRIEF DESCRIPTION OF THE DRAWINGS

The present disclosure is further described in the detailed description which follows in reference to the noted plurality of drawings by way of non-limiting examples of embodiments of the present disclosure in which like reference numerals represent similar parts throughout the several views of the drawings.

DETAILED DESCRIPTION

Figure 1:
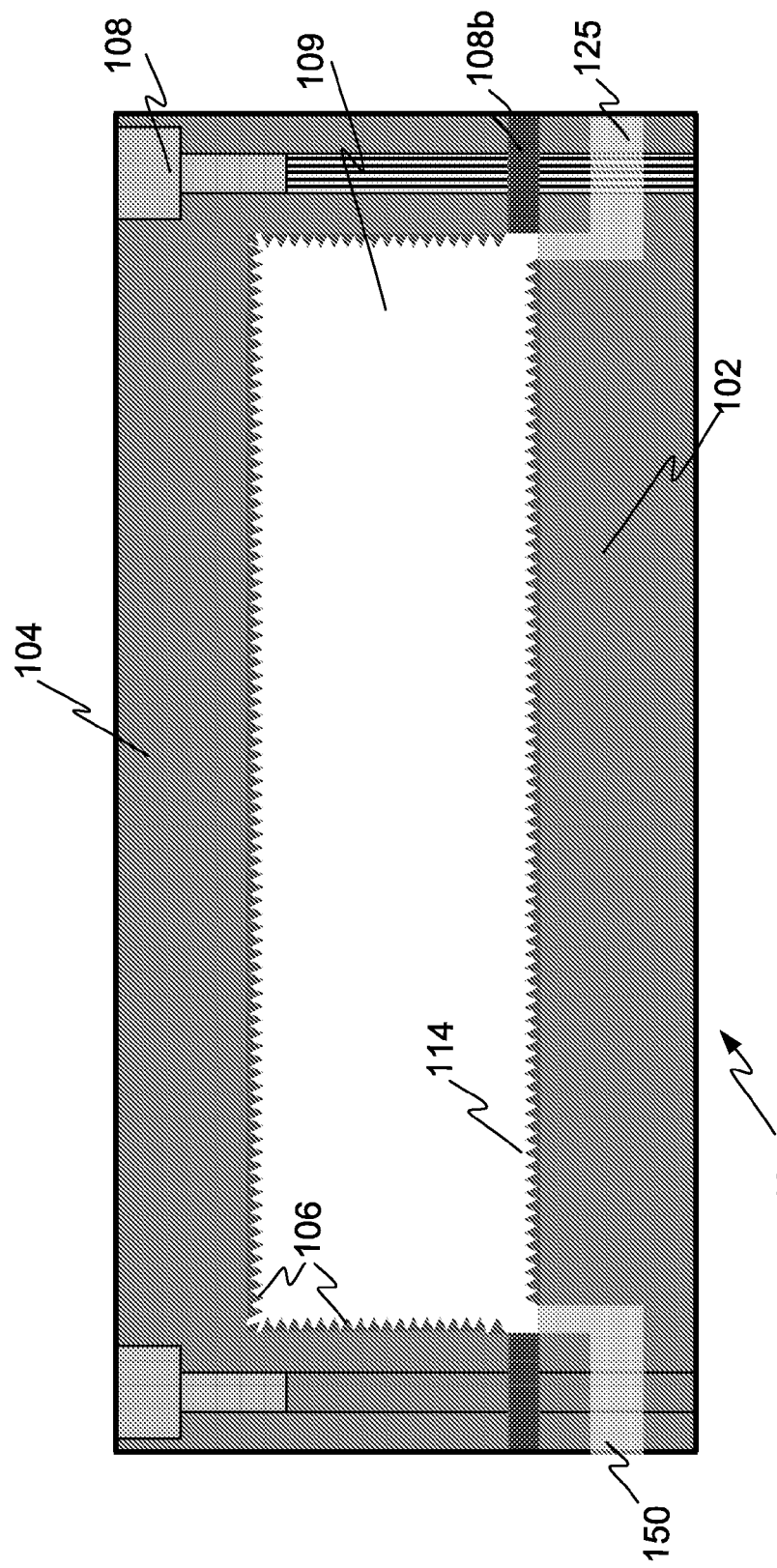
FIG. 1 illustrates an example of a thermal diode according to an exemplary embodiment of the present disclosure.

Disclosed and described is a new paradigm of asymmetric heat transfer and control. In one aspect, a thermal diode comprising a vapor chamber, with liquid disposed in the vapor chamber, the chamber defined by a superlyophobic surface (on which the working liquid exhibits a large apparent contact angle approaching 180° and a small contact angle hysteresis) and a lyophilic surface (on which the contact angle is less than 90°, approaching 0° for the superlyophilic case) provides a unique phenomenon: condensate drops nucleating on a superlyophobic condenser spontaneously jump out-of-plane from the condenser. This self-propelled motion is generally believed to be powered by the surface energy released upon coalescence of liquid drops, and out-of-plane (perpendicular to the surface) jumping results from the impact the liquid bridge of the coalesced drops on the superlyophobic substrate.

In addition to being highly efficient in terms of phase-change heat transfer, superlyophobic condensers as disclosed also inherently yield an asymmetric flow of fluid and heat when placed adjacent to a lyophilic surface. This concept provides numerous advantages and benefits for the instant thermal diode device not found in other thermal diode constructs. When the lyophilic surface is thermally coupled to a heat source (forward mode), the liquid vapor is condensed on the spaced apart superlyophobic surface and the condensate spontaneously jumps back to the evaporator, resulting in continuous and efficient phase-change heat transfer. On the superlyophobic surface, coalescence of the liquid drops results in a reduction in surface area of coalesced drops, the reduction of surface area leads to a reduction in surface energy which is converted to kinetic energy. The liquid bridge formed between coalescing drops is initially above the superlyophobic surface because of the very large contact angle, unlike conventional surfaces with lower contact angle. The evolving liquid bridge impacts the superlyophobic surface, and the counter force from the surface gives rise to the unique out-of-plane jumping motion of the merged drops.

When the superlyophobic surface is heated, however (reverse mode), the condensate forms on the lyophilic surface and is prevented or restricted from returning to the evaporator, as the "jumping transport" is unique to superlyophobic surfaces. This results in dry-out of the superlyophobic evaporator and subsequently very ineffective heat transfer for the reverse mode, provided that the side walls of the chamber are sufficiently insulated. Therefore, a high diodicity for this system is achievable, with very high heat transfer for heat flowing through the lyophilic side and very poor heat transfer for heat flowing through the superlyophobic side.

Superlyophobic Surfaces

As used herein, superlyophobic surfaces are intended to provide little or essentially no interfacial interaction with the working fluid of the instant thermal diode. Superlyophobic surfaces are inclusive of superhydrophobic surfaces. Superlyophobic surfaces are typically fabricated by roughening a substrate (or a coated substrate) that is lyophobic to the working fluid. The surface roughness typically comprises of microscale and/or nanoscale textures. Exemplary superlyophobic surfaces are described in "Dropwise Condensation on Superhydrophobic Surfaces with Two-Tier Roughness," Chuan-Hua Chen et al., *Applied Physics Letters* 90 (2007) pages 173108-1 to 173108-3; "Remarkably Simple Fabrication of Superhydrophobic Surfaces Using Electroless Galvanic Deposition," Iain A. Larmour et al., *Angewandte Chemie International Edition* 46 (2007) pages 1710-1712. "Superhydrophobic Surfaces," Minglin Ma and Randal M. Hill, *Current Opinion in Colloid & Interface Science* 11 (2006) pages 193-202; and "Design Parameters for Superhydrophobic and Superoleophobicity," Anish Tuteja et al., *MRS Bulletin* Volume 33, August 2008, pages 752-758.

For example, the superlyophobic surface material can be of a thermally conductive material, such as a metal. The metal can be roughened, for example, galvanized in a manner such that a suitable surface architecture is provided. A suitable surface architecture includes microstructures and/or nanostructures that can be functionalized with a coating having the desired lyophobic properties. In some aspects, nanostructured metal surfaces are preferred.

Copper can be modified in a number of ways to provide a suitable surface architecture. By way of example, electroless galvanic deposition of conductive metals can be employed to prepare a suitable surface. For example, a suitable surface architecture can be formed on copper by (a) electroless galvanic deposition of silver nanoparticles; (b) chemically etching polycrystalline copper, with or without photolithography; or (c) coating copper hydroxide nanoneedles by in-solution anodization. In one aspect, a suitable surface is provided from silver on copper. Other surface treatments can also be used to provide the desired surface roughness. Thus, copper is subjected to a short, one-step galvanic reaction to provide a nanostructured surface with silver nanoparticles. A galvanic copper-silver surface of nanostructural dimension prepared in this manner is shown in the electron micrograph image depicted in FIG. 6.

The resultant copper-silver surface with surface textures can be coated using well-established thiol chemistry, for example, a superhydrophobic surface results if the roughened surface is coated with alky-terminated thiol. The thermal stability of thiol coating can be improved by cross-linking the self-assembled monolayer, or, more stable silane coating can be used instead of the thiol coating.

Other surface modifications can be performed on the metal surface to provide the requisite wettability properties, for example, flame-treatment, plasma-treatment, and chemical vapor deposition of a surface may also be used alone or in combination with the above methods.

Superlyophobic surface can also be created on silicon. In one example, the surface nanotexture on silicon can be created using a thin layer (~5 nm) of sputter-coated gold particles as etch mask, and a $HF/H_2O_2$ solution (49% HF, 30% $H_2O_2$, and $H_2O$ with a volume ratio of 1:5:10) as the chemical etchant. The nanostructured silicon can be rendered superlyophobic by the thiol coating described above.

(Super)Lyophilic Surfaces

As used herein, lyophophilic surfaces are intended to provide strong interfacial interaction with the working fluid of the instant thermal diode. Many native surfaces are lyophilic to a specific working fluid, for example silicon (with a thin layer of native oxide) to water and copper surface to ethanol. The native oxide on both silicon and copper is a very stable lyophilic coating in a wide range of temperatures. As used herein, lyophilic surfaces are inclusive of hydrophilic surfaces.

To render lyophilic surfaces superlyophilic, the surface needs to be imparted with microstructures and/or nanostructures, similar to the creation of superlyophobic surfaces described above. The same surface texture can be turned either superlyophobic or superlyophilic by a judicious choice of coating. As an example, the surface nanostructures depicted in FIG. 6 can be turned either superhydrophobic with a monolayer coating of carboxylic-acid-thoil or superhydrophilic with alky-terminated thiol. Similarly, the silicon nanostructures described above can be turned superlyophobic or superlyophilic depending on the surface coating. Hydrophilic coating includes, for example, hydroxyl, carboxylic, or amine-terminated groups, and combinations thereof. Thus, numerous superlyophobic surfaces can be adapted to the fabrication of superlyophilic surfaces, and a variety of materials and methods are available to produce superlyophobic and/or superlyophilic surfaces.

Fluid Material

In one aspect, the fluid of the instant thermal diode can be a liquid or a material that becomes liquid at the operating temperature of the diode. In one aspect, the fluid used can be liquid water. Other fluids can be used as the liquid, provided that the fluid undergoes a phase change in a temperature range corresponding to the temperature range of the body under operating conditions, and the superlyophobic and (super)lyophilic structures can be constructed for the chosen fluid. Other liquids include, for example, alcohols and mercury. The fluid can be liquid sodium metal, and the like.

The jumping drop phenomenon that is employed in the operation of the thermal diode has been reported for at least water, ethanol and mercury, indicating some flexibility in choosing the fluid. Most fluid/solid device combinations normally used in heat pipes and vapor chambers can be used to provide the jumping phenomenon of the instant thermal diode device.

In some aspects, it is desirable to provide a stable superhydrophobic and (super)hydrophilic structure to the surface of the chamber. Stable superhydrophobic and (super)hydrophilic structures have been widely demonstrated, some examples were shown above. For working liquid other than water, special surface design (such as reentrant structures) may become necessary. Reentrant superlyophobic silicon structures have been demonstrated for heptane, for example, a liquid with very low surface tension.

In a preferred aspect, the liquid is water. In a most preferred aspect, water is used in combination with a copper evaporator/condenser configuration. The water/copper combination is demonstrated to be very stable over long-term testing of heat pipes. Water offers high heat capacity while copper offers high thermal conductivity. Copper is also commonly used in heat transfer devices, and there are existing solutions to deal with practical problems such as thermal expansion mismatch and corrosion.

Other fluid/surface combinations, e.g. those commonly used in heat pipes, are envisaged to provide similar performance attributes suitable for use in the instant thermal diode.

Separation of the Superlyophobic/(Super)Lyophilic Surfaces

Although the lateral dimensions of the planar thermal diode can be, essentially arbitrarily large (with ribs enhancing stability if necessary), the separation between the superhydrophobic and superhydrophilic plates is somewhat limited by the distance a jumping drop can travel against gravity and against air/vapor friction. The departing velocity of a jumping drop follows a capillary-inertia scaling as in equation (1):

$$v \propto \sqrt{\sigma/\rho r}, \quad (1)$$

where σ (sigma) and ρ (rho) are surface tension and density of the liquid, and r is the radius of the drop. As confirmed by applicants experiments, the scaling law shows that velocity is a function of drop radius, e.g. smaller drops tend to jump higher as long as the inertia dominates over viscosity. To complicate the problem further, vapor flow from the evaporator exerts a viscous drag on the jumping drops, and the drag is likely dependent on the heat flux. Empirically, applicants have determined a useful separation of about 2 mm based on open-system tests.

An important figure of merit for a thermal diode is its diodicity ($\eta_D$) as defined by equation (2), $$\eta_D = k_f/k_r, \quad (2)$$

where $k_f$ and $k_r$, are respectively the forward and reverse effective thermal conductivity. In reverse mode operation, the effective thermal conductivity of an entire device is mainly dictated by the solid joints. For the instant thermal diode, considering that the vapor chamber occupies the majority of the cross section area (e.g. >90% for a device of 5" diameter), the effective thermal conductivity in the reverse mode can be controlled to be $k_r < 1$ W/m·K provided that poor thermal conductors are used as spacers between surfaces. Insulation with minimized solid joints is believed sufficient to drive the effective reverse conductivity of the instant thermal diode to about $k_r < 0.1$ W/m·K.

An effective thermal conductivity in the forward mode is governed by the phase-change heat transfer at both the condenser and evaporator. The average diameters of steady-state water condensate formed on the instant superhydrophobic condenser surface is only about 5 μm, or about 100× smaller than the average size of condensate drop gravitationally removed from a non-superhydrophobic surface. As a result, the instant thermal diode device provides for faster and more efficient removal (return) of condensate drops to the evaporator. Since the convection heat transfer coefficient increases with this earlier removal of condensate, the instant superlyophobic condenser exhibits a heat transfer coefficient roughly an order of magnitude larger than currently known dropwise condensers. Therefore, the instant thermal diode device should easily achieve a heat transfer coefficient of up to about $10^5$ W/m²·K, which has been obtained with gravity-assisted, condensate removal. A heat transfer coefficient of up to about $10^6$ W/m²·K is achievable with an average condensate drop diameter of about 5 micron. With a superhydrophilic evaporator that promotes liquid spreading and delays dry-out, the condensation rate is likely to be the rate-limiting step. This belief is consistent with the operation principle that fundamentally depends on the jumping motion on the condenser. A conservative estimate of the forward conductivity is $k_f = 10^5$ W/m²K×2 mm=200 W/m·K. Based on these estimates, a diodicity of about 10 to over about 100 is achievable with the instant thermal diode device, and conceivably, a diodicity of more than 1000 is possible.

The separation of the plates of the instant thermal diode device can be designed with some flexibility, where the spacing between the plates is fixed at certain positions and allowed to vary at other portions or positions. This allows for the fabrication of useful materials that require flexibility, such as covers, textiles, or other conforming shapes/structures.

The following detailed description of embodiments refers to the accompanying drawings which illustrate specific embodiments of the disclosure. Other embodiments having different structures and operations do not depart from the scope of the present disclosure.

FIG. 1 depicts a thermal diode embodiment of the present disclosure with asymmetric wettability. Thus, device 100 comprises first plate 104 having superlyophobic surface 106 separated from second plate 102 having lyophilic surface 114 by adjustable elements 108 and 108b, which can provide a separation between the plates. Other spacing configurations can be used such as adhesive gaskets to define the separation between the plates. Preferably the spacer material is non-conducting of heat to optimize the mechanism of the instant thermal diode configuration. In one aspect, the spacer material comprises a latex rubber, synthetic rubber, polyurethane elastomer, fluoroelastomer, silicone elastomer or silicone thermoset rubber. Other materials can be used. The walls of the spacing elements exposed to the chamber can be coated with or comprise superlyophobic surface 106. Vacuum port 150 provides for evacuation of the device. Liquid medium can be introduced via charging port 125. Vacuum port and charging port can be permanently or reversibly sealable.

Figure 2:
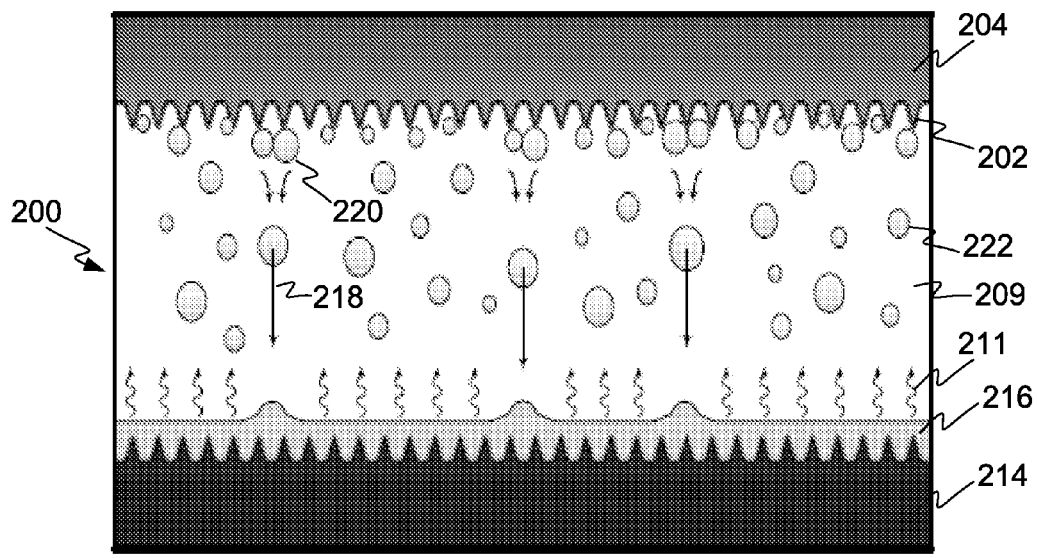
FIG. 2 is a diagram of an example of a thermal diode according to an exemplary embodiment of the present disclosure operating in a forward mode providing cooling to a body.

FIG. 2 is a diagram of an example of a device 200 for cooling a body, e.g., an electronic device or the like, according to an exemplary embodiment of the present disclosure. Device 200 includes an evaporator surface 214 and a condenser 204. The evaporator surface 214 may be wickless. The evaporator surface can also be the back side of a bare microprocessor chip or other electronic device. The evaporator surface 214 may also be a material with high thermal conductivity characteristics to transfer heat energy from a device to which the device 200 may be thermally coupled for cooling. The terms "evaporator" and "condenser" are assigned to the opposing sides (or plates) of the instant thermal diode with specific reference to its forward mode operation. During reverse mode operation, the terms "evaporator" and "condenser" correspond to the superlyophobic surface and the (super)lyophilic surface, respectively, but not to the corresponding function.

Device 200 may be formed by enclosing substrates 204 and 214 through a spacer (shown in FIG. 1) to define a predetermined volume of chamber 209. A superlyophobic surface 202 may be disposed or formed on the condensor substrate 204 within the device 200. Superlyophobic surface 202 may comprise of a textured surface with microstructures and/or nanostructures and/or contain superlyophobic coatings. Similarly, a (super)lyophilic surface may be disposed or formed on the substrate 214. The liquid 216 may be water or some other fluid with properties to enhance the operation of the device 200 for thermal rectification and/or cooling.

In the forward mode depicted in FIG. 2, liquid 216 is evaporable caused by heat transferred to the evaporator 214 to form a vapor. The vapor may traverse to the superlyophobic condenser 204 to form a plurality of liquid drops 220. The drops 220 coalesce on the superlyophobic condenser 204. The coalescence releases surface energy and propels the merged drop 218 to jump back to the evaporator 214. The self-propelled jumping completes the liquid recirculation to continuously remove heat from evaporator 214 and reject it at condenser 204. The continuous phase-change process provides highly effective heat transport.

Figure 3:
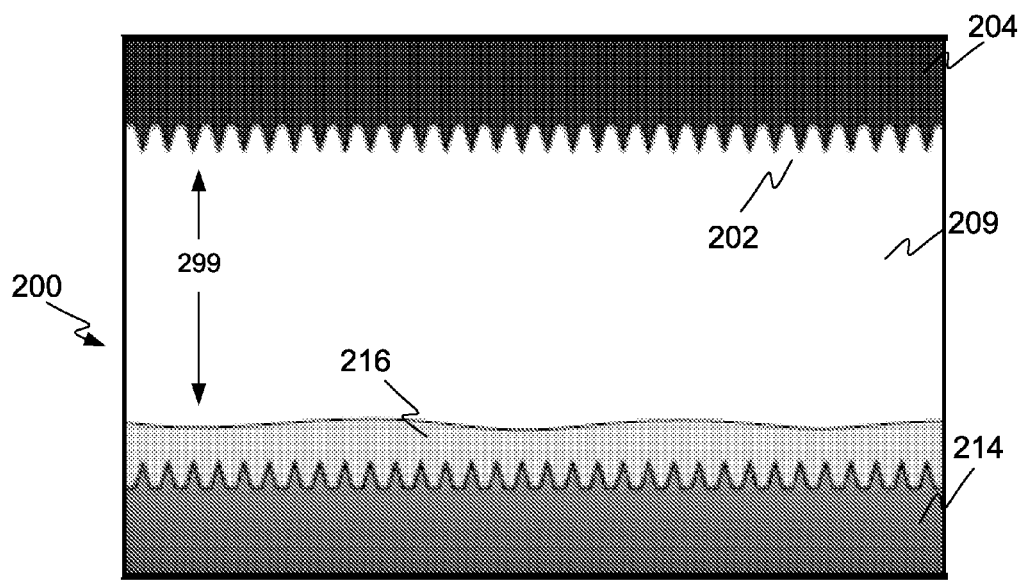
FIG. 3 is a diagram of an example of a thermal diode according to an exemplary embodiment of the present disclosure operating in a reverse mode providing thermal insulation to a body.

In the reverse mode depicted in FIG. 3, a liquid 216 is contained within the volume adjacent to the (super)lyophilic substrate 214, and is restricted or prevented from vaporizing. There is no path for liquid recirculation from substrate 214 to substrate 204 as the opposing plates are separated by a predetermined distance 299. The low thermal conductivity of vapor in combination with the non-thermally conductive sealing material provides for effective thermal insulation.

As is evident, device 200 overcomes the disadvantages of the prior art phase change vapor chambers and thermal diodes. The need for a wick structure and capillary transport are eliminated. Device 200 operates independently of orientation (gravitationally independent) and has a simple structure.

Figure 4:
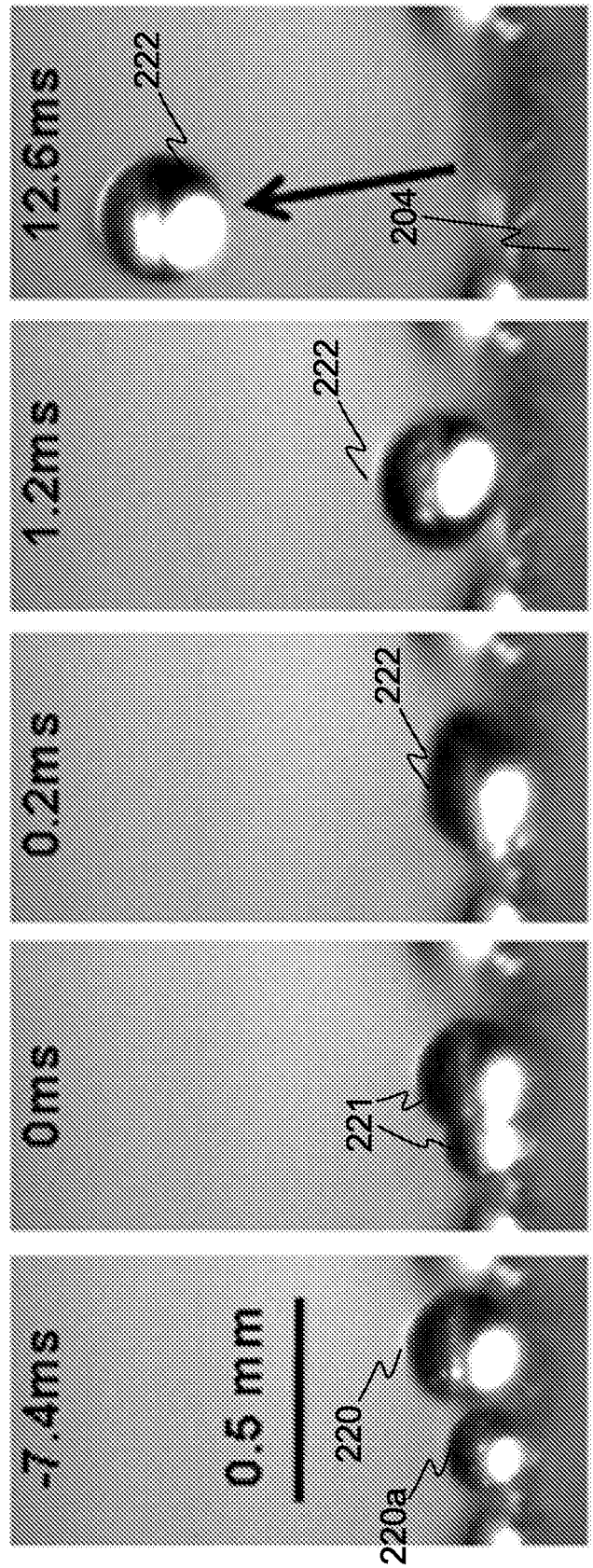
FIGS. 4A, 4B, 4C, 4D, and 4E are a time-lapsed sequence of images depicting the coalescence of liquid droplets of a liquid on a superlyophobic surface, including the propelling of a single droplet off the superlyophobic surface.

The self-propelled jumping process is illustrated in the sequential images of FIGS. 4A-E. Two condensate water drops 220 (FIG. 4A) make contact and begin to initiate coalescence. The drops continue to coalesce together on the superhydrophobic surface 204 (FIGS. 4B-C) and released surface energy propels the merged drop 222 upward, perpendicular to the superhdyrophbic surface 204 (FIG. 4D). Surface energy is released due to a reduction in surface area when drops coalesce together. The jumping motion is believed to be powered by the released surface energy, and the out-of-plane directionality (FIG. 4E) is believed to result from the impact of the liquid bridge formed between coalescing drops 221 (FIG. 4B) on the superhydrophobic surface 204. The velocity of such jumping drops can reach as high as 1 m/s with an initial acceleration as high as 1000 G. Operationally, the thermal diode is gravitationally independent, and the condensate drops are removed faster than a non-superhydrophobic surface.

In one aspect, the operating mode of the planar thermal diode depends, in part, on the direction of the temperature gradient between a body at a first temperature and the thermal diode at a second temperature. This provides a forward and reverse mode of operation. In a first mode of operation, designated "the forward mode" (FIG. 2), liquid evaporates from the hotter lyophilic surface (evaporator) thermally coupled to a hot body, resulting in the vapor condensing on the colder superlyophobic surface (condenser) at a predetermined distance from the hotter evaporator. Condensate drops coalesce on the superlyophobic surface and spontaneously jump back to the lyophilic surface, proving a continuous liquid circulation that results in a highly effective, two-phase heat transfer process suitable for cooling. It is generally believed that the dominating heat transfer mode with forward temperature bias is phase-change convection in the forward mode.

In a second mode of operation, designated "the reverse mode" (FIG. 3), the lyophilic surface is operated or provided at a temperature colder than the superlyophobic surface. In this mode, liquid film adheres or is absorbed to the lyophilic surface, and negligible heat transfer takes place through the vapor space between the lyophilic and superlyophobic surfaces. It is generally believed that the reverse bias is heat conduction, giving rise to thermal rectification in the instant thermal diode with asymmetric wettability of the inner walls defined by the lyophilic and superlyophobic surfaces.

The disclosed planar thermal diode has at least the following advantages over existing thermal diodes and heat transporting/controlling systems. First, unlike liquid trap heat pipes and non-uniform nanotubes, which are essentially one-dimensional, the instant thermal diode can be configured of an essentially planar design and is therefore adaptable to 3D integration. Secondly, the instant thermal diode provides a high diodicity with the effective thermal conductivity in forward mode operation at least 1.5× that of the reverse mode, which is an improvement over solid-state diodes with a diodicity of less than 1.1. Thirdly, the instant thermal diode provides for seamless integration of two-phase heat transfer and effective thermal rectification, unlike heat-pipe diodes with rectifying components compromising heat transfer performance.

Numerous devices and processes will benefit from effective thermal rectification provided by the disclosed and described thermal diode. For example, in 3D microsystems, the instant thermal diode will direct heat flow away from the most sensitive/fragile layer of microelectromechanical (MEMS) components. In another example application, such as an energy harvesting system, the thermal diode disclosed and described herein can be adapted to harvest and store thermal energy under cyclic environmental temperature. In harsh weather or hostile battlefields, the thermal diode disclosed and described herein can be adapted to reject waste heat from a human body or microelectronics without undesired heat influx. The thermal diode can be thermally coupled to essentially any heat generating body, such as, an electronic device, a biological system, a dwelling, a motorized vehicle, a satellite, or an aerospace vehicle. The biological system can be any living organism covered or coupled to the thermal diode, for example, as a fabric or other flexible or non-flexible covering. The dwelling can be a stationary structure or can be a mobile or portable structure, such as a tent or shelter.

Experimental Results

Figure 5:
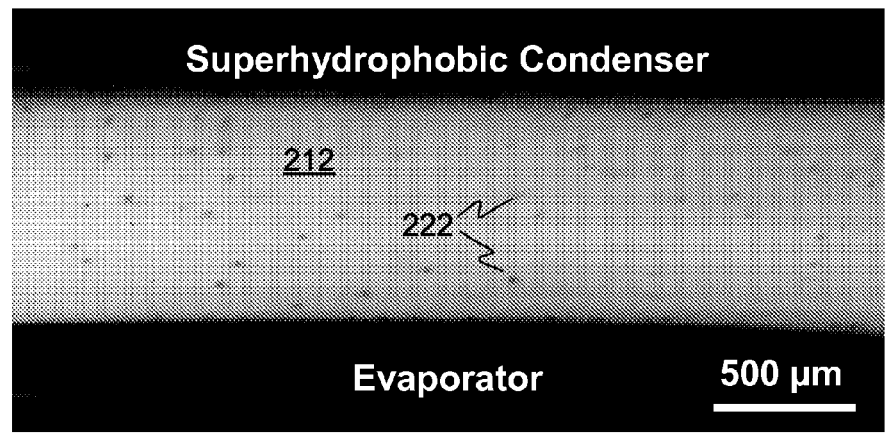
FIG. 5 is single still-frame micrograph of an example thermal diode according to an exemplary embodiment of the present disclosure depicting the propelling of liquid droplets from a superlyophobic surface.

Planar Thermal Diode Fabrication Examples: Superhydrophobic and superhydrophilic nanostructures using silicon micromachining techniques were fabricated. Thus, nanostructures were created on a silicon substrate coated a 5 nm gold film etched with a $HF/H_2O_2$ solution. The textured silicon was coated with hexadecanethiol or silicon dioxide to create superhydrophobic or (super)hydrophilic surfaces for a water-based device. An open-system proof-of-concept experiment showed condensate drops returned from the superhydrophobic condenser to the superhydrophilic evaporator. These prototypes demonstrated the proof-of-concept for the basic process of the instant planar thermal diode—the self-propelled jumping motion of condensate drops. FIG. 5 is a digital image with an exposure time of 150 fps, showing multiples drops simultaneously jumping back from the superhydrophobic condenser to the hydrophilic evaporator. As shown, gravity slightly assists the liquid return but the device is essentially gravitationally independent (see also FIG. 4 in which the jumping is against gravity). Powered essentially by released surface energy upon coalescence, condensate drops spontaneously jump off the superhydrophobic surfaces regardless of the surface orientation, e.g. against gravity and along.

Figure 6:
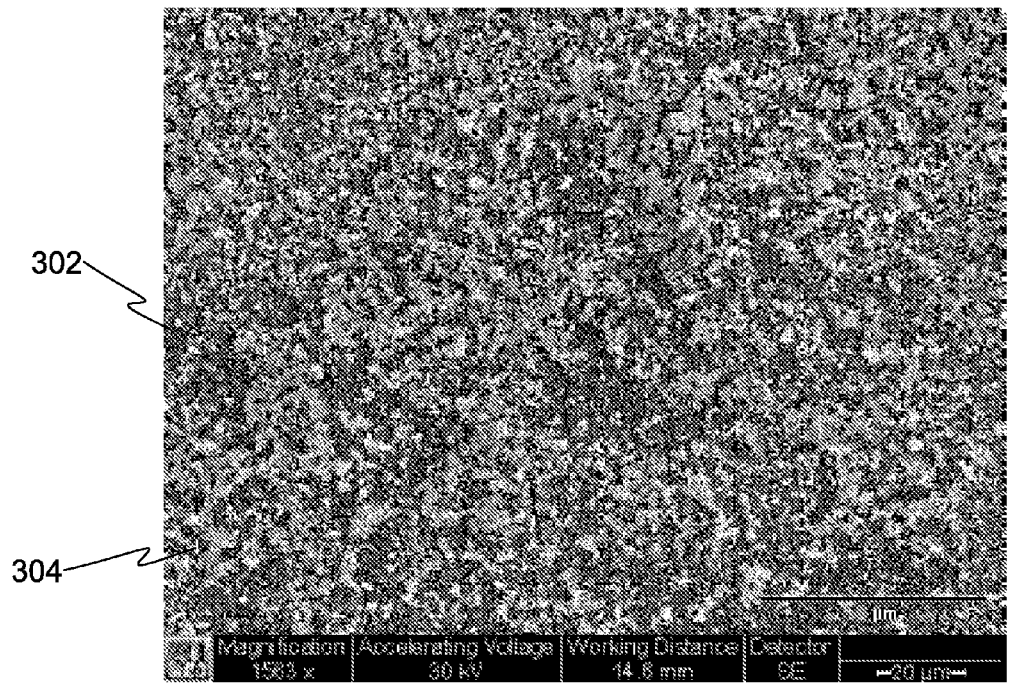
FIG. 6 is a scanning electron micrograph of an exemplary superlyophobic surface with galvanized surface roughness.
Figure 7A:
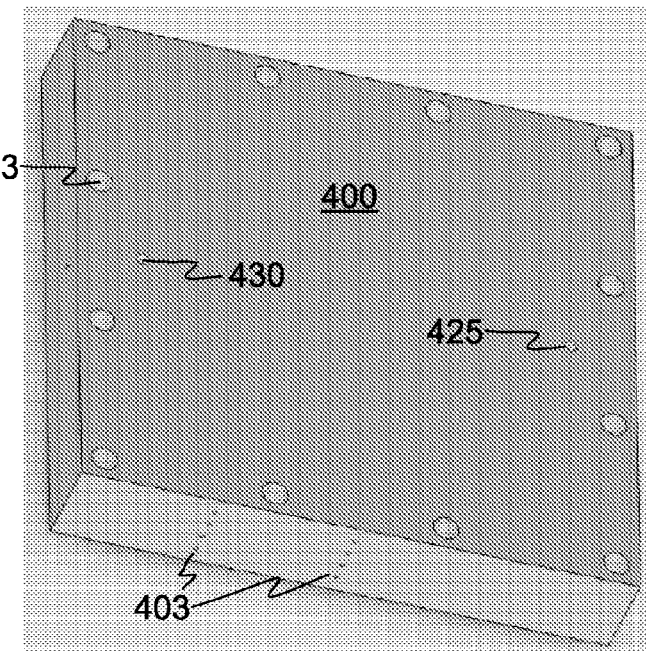
FIGS. 7A and 7B are prospective and transparent views, respectively, of the first plate of a thermal diode according to an exemplary embodiment of the present disclosure.
Figure 7B:
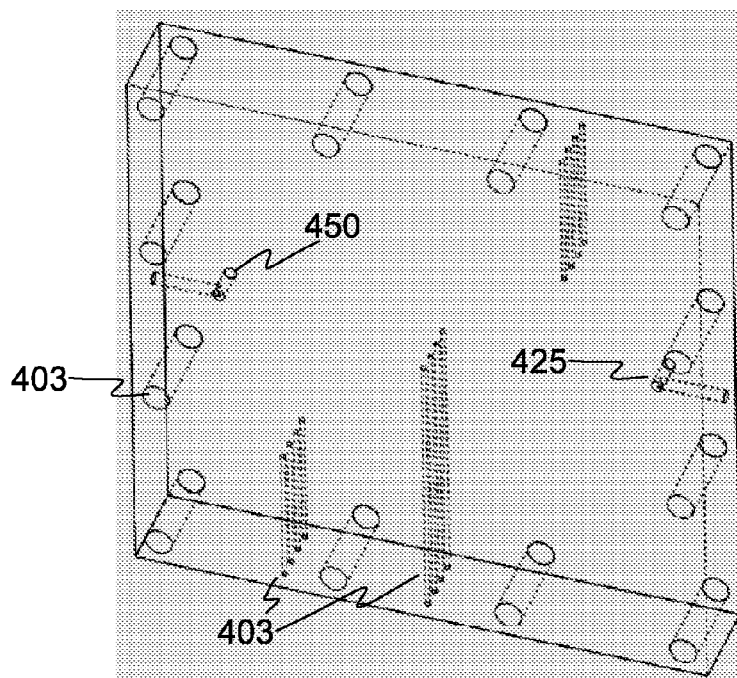
Figure 8A:
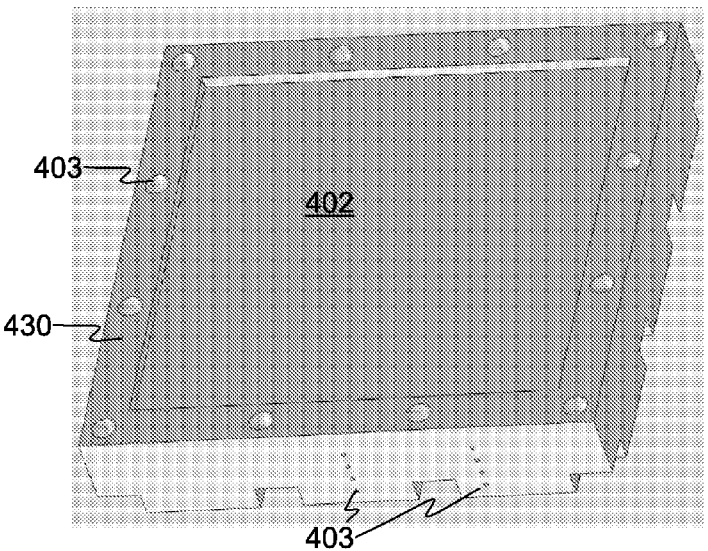
FIGS. 8A and 8B are prospective and transparent views, respectively, of the second plate of the thermal diode according of FIGS. 7A and 7B.
Figure 8B:
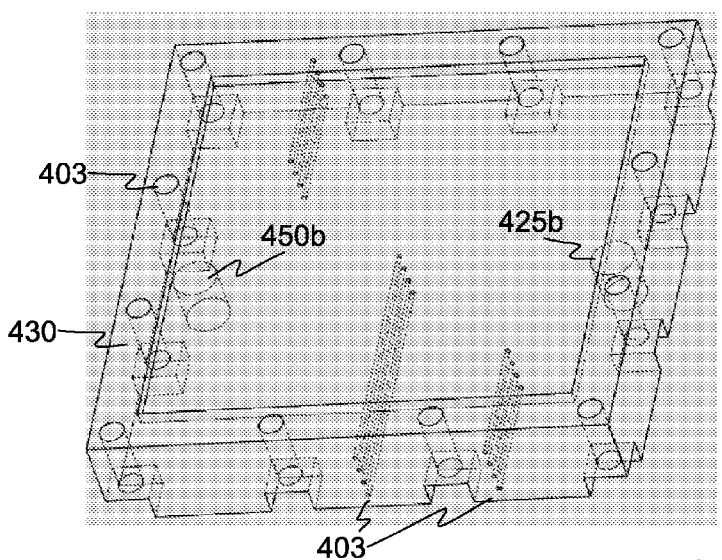

A metallic thermal diode device was constructed with a copper superhydrophobic side and a copper superhydrophilic side. Surface roughness was deposited onto the copper plates by electroless galvanic deposition via immersion in 10 mM silver nitrate, and subsequently immersed in 1 mM 1-hexadecanethiol for providing superhydrophobicity or 16-mercaptohexadecanoic acid for providing (super)hydrophilicity. FIG. 6 is a micrograph of an exemplary superhydrophobic surface prepared from copper by electroless galvanic deposition that is suitable for use in the instant device. Surface 302 comprises nanometer textured features 304.

An exemplary test device was constructed as follows with reference to FIGS. 7A, 7B, 8A, 8B. Copper sheet was used to provide a first plate 400 having a plurality of holes 403 drilled through the perimeter such that a second copper plate 402 of the device can be firmly secured together at a desired distance apart. Spacer 430 is placed about the perimeter of the first and second plates to create a chamber and to provide a tight seal and also to minimize heat transfer through the side walls. On plate 400, L-shaped vacuum port 425 and L-shaped charging port 450 are welded from copper tubing and align with conduits 425b and 450b, respectively, of plate 402. Thermocouple arrays 407 were drilled into both plates to measure temperatures. Temperature was measured by the difference between two thermocouples, which were inserted into the side walls of the condenser and evaporator. The central thermocouple holes closest to the inner chamber were used.

The overall thermal diode dimension was 75 mm×75 mm×28 mm, while the vapor chamber was 50 mm×50 mm×2.8 mm. Approximately 2.0 mL DI water was charged into the chamber as working fluid. A film heater controlled by a power supply was attached on the evaporator and a cold plate chilled by a circulator was attached on the condenser. During the test period the heater was supplied with a constant power of 40 W, and the side of the heater not touching the thermal diode was thermally insulated by a teflon plate. The water bath of the circulator was set at constant temperature 20° C.

For the forward mode (hydrophilic evaporator, superhydrophobic condenser), the evaporator temperature at steady stae was measured as $T_{E,f}$=60° C. while the condenser temperature was measured as $T_{C,f}$=30° C. For the reverse mode (superhydrophobic evaporator, hydrophilic condenser), the evaporator and condenser temperature were measured as $T_{E,r}$=73° C. and $T_{C,r}$=28° C., respectively.

Based on the experimental results, the diodicity of this thermal diode at the specified test conditions is calculated as in equation (3)

$$\eta_D = k_f/k_r = \Delta T_r/\Delta T_f = 45°/30° = 1.5 \quad (3)$$

where $k_f$ and $k_r$ are respectively the forward and reverse effective thermal conductivity, and $\Delta T_f$ are $\Delta T_r$ are respectively the forward and reverse temperature difference. This diodicity measurement is from very preliminary results. The diodicity is expected to dramatically increase with optimized system parameters, including but not limited to, the amount of charging liquid, the vacuum level of the vapor chamber, the surface structures of the superhydrophobic and (super)hydrophilic surfaces, the spacing between superhydrophobic and (super)hydrophilic surfaces, and other geometrical and material designs of the thermal diode. The instant thermal diode demonstrated a diodicity of at least 1.1, with an actual diodicity of about 1.5. It is envisaged the instant diode will obtain a diodicity of greater than 10, and can conceivably obtain a diodicity between 10 and about 100 or greater, with the likelihood of a diodicity of about or above 1000.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A thermal diode comprising:
   a superlyophobic surface;
   a lyophilic surface separated from the superlyophobic surface and defining a chamber; and
   a liquid in the chamber, the liquid capable of continuous phase changing during operation of the thermal diode independent of gravity and orientation.

2. The thermal diode of claim 1, wherein the thermal diode has a diodicity of at least 1.1.

3. The thermal diode of claim 1, wherein the thermal diode has a diodicity of at least 1.5.

4. The thermal diode of claim 1, wherein the thermal diode has an aspect ratio defined as either a length or a width over a height of greater than 2, such that the thermal diode is essentially two-dimensional.

5. The thermal diode of claim 1, further comprising a spacer to separate the superlyophobic and lyophilic surfaces a predetermined distance.

6. The thermal diode of claim 1, wherein the spacer provides fluidic sealing of the chamber and prevents or reduces thermal conduction during operation of the thermal diode.

7. The thermal diode of claim 1, wherein at least one of the superlyophobic surface and the lyophilic surface comprises copper, silicon, aluminum, or steel.

8. The thermal diode of claim 1, wherein the superlyophobic surface is disposed on or formed on a surface comprising copper, silicon, aluminum, or steel.

9. The thermal diode of claim 1, wherein the liquid is water.

10. The thermal diode of claim 1, wherein at least one of the superlyophobic surface and the lyophilic surface is disposed on or formed on a copper surface and the liquid is water.

11. The thermal diode of claim 1, wherein the lyophilic surface is superlyophilic.

12. The thermal diode of claim 1, wherein thermal rectification with a diodicity of at least 1.1 is integrated with two-phase heat transfer with a coefficient of at least 1,000 W/m2·K.

13. The thermal diode of claim 1, wherein the lyophilic surface is wickless.

14. A system comprising:
   (i) a thermal diode comprising:
      a superlyophobic surface;
      a lyophilic surface separated from the superlyophobic surface and defining a chamber; and
      a liquid in the chamber, the liquid capable of continuous phase changing during operation of the thermal diode independent of gravity and orientation;
   and
   (ii) at least one body thermally coupled to the thermal diode.

15. The system of claim 14, wherein the body is selected from at least one of an electronic device, a biological system, a medical implant, a dwelling, a construction material, a window, a motorized land or water vehicle, a satellite, an aerospace vehicle, a chemical processing plant, a power plant, a mechanical machine, an electromechanical system, an energy harvesting device, a nuclear reactor, and an energy storage system.

16. A method of rectifying heat flow, the method comprising providing a chamber having asymmetric surface wettability, the chamber defined by
   a superlyophobic surface;
   a lyophilic surface separated from the superlyophobic surface; and
   a liquid disposed in the chamber, the liquid capable of continuous phase changing during operation of the thermal diode independent of gravity and orientation; and
   transporting the liquid asymmetrically in the chamber between the superlyophobic surface and the lyophilic surface.

17. The method of claim 16, wherein the superlyophobic surface provides for the conversion of surface energy associated with coalesced drops of the liquid to kinetic energy.

18. The method of claim 16, further comprising transferring heat from a heated body sufficient to evaporate at least some of the liquid from the lyophilic surface and to provide vapor droplets of the liquid; and coalescing at least some of the vapor droplets on the superlyophobic surface at a temperature lower than the lyophilic surface; and cooling the body.

19. The method of claim 16, wherein a heated body is in contact with the superlyophobic surface; wherein the method further comprises containing the liquid on or in the lyophilic surface, and preventing or reducing heat transfer from the body.

20. The method of claim 16, wherein the thermal diode has a diodicity of at least 1.1.

21. The method of claim 16, wherein the thermal diode has a diodicity of at least 1.5.

22. The method of claim 16, wherein the thermal diode has an aspect ratio defined as either a length or a width over a height of greater than 2, such that the thermal diode is essentially two-dimensional.

23. The method of claim 16, further comprising a spacer adjusting the distance between the superlyophobic surface and the lyophilic surface.

24. The method of claim 23, wherein the spacer provides fluidic sealing of the chamber and prevents or reduces thermal conduction during operation of the thermal diode.

25. The method of claim 16, wherein the surfaces comprises copper or silicon.

26. The thermal diode of claim 1, wherein the liquid is water.

27. The method of claim 16, wherein at least one of the lyophobic surface and the lyophilic surface is disposed on or formed on a copper or silicon surface and the liquid is water.

28. The method of claim 16, wherein the lyophilic surface is superlyophilic.

29. The method of claim 16, wherein thermal rectification with a diodicity of at least 1.1 is integrated with two-phase heat transfer with a coefficient of at least 1,000 W/m2·K.

30. The method of claim 16, wherein the evaporator is wickless.

* * * * *